United States Patent [19]
DuBois et al.

[11] Patent Number: 5,393,642
[45] Date of Patent: Feb. 28, 1995

[54] IONIC MODIFICATION OF ORGANIC RESINS AND PHOTORESISTS TO PRODUCE PHOTOACTIVE ETCH RESISTANT COMPOSITIONS

[75] Inventors: Thomas D. DuBois; Farid M. Tranjan, both of Charlotte; Stephen M. Bobbio, Wake Forest, all of N.C.

[73] Assignee: The University of North Carolina at Charlotte, Charlotte, N.C.

[21] Appl. No.: 999,208

[22] Filed: Dec. 31, 1992

[51] Int. Cl.⁶ .............................................. G03F 7/09
[52] U.S. Cl. ................................... 430/271; 430/191; 430/270; 430/914; 430/925
[58] Field of Search ............... 430/270, 271, 914, 925, 430/191

[56] References Cited

U.S. PATENT DOCUMENTS 4,968,582  11/1990  Tranjan et al. ...................... 430/270
5,114,827   5/1992  Tranjan et al. ...................... 430/271

OTHER PUBLICATIONS

"Photolysis of Tris (4-tert-butoxycarbonyloxyphenyl) Sulphonium Salts. A Mechanistic Study," Reinhold Schwalm, Ruth Bug, Guang-Song Dai, Peter M. Fritz, Michael Reinhardt, Siegfried Schneider and Wolfram Schnabel, *J. Chem. Soc. Perkin Trans.* 2, 1991.

"Electrochemical Degradation of Aryl Sulfonium Salts," Manuel Finkelstein, Raymond C. Peterson, and Sidney D. Ross, *Journal of the Electrochemical Society*, vol. 110, No. 5, May 1963.

"A New Mechanism for Photodecomposition and Acid Formation from Triphenylsulphonium Salts," John L. Dektar and Nigel P. Hacker, *J. Chem. Soc., Chem. Commun.*, 1987.

"Photochemistry of Aromatic Ions. Photolysis of Quaternary Anilinium Salts," Thomas D. Walsh, Robert C. Long, *Journal of the American Chemical Society*, 89, 3943 (1967).

"Photolysis of Benzyltriphenylphosphonium and Tetraphenylphosphonium Chlorides," C. E. Griffin and M. L. Kaufman, *Tetrahedron Letters* No. 12, pp. 773–775, 1965. Pergamon Press Ltd.

"The Electroreduction of Quaternary Ammonium Compounds," Jaspal S. Mayell and Allen J. Bard, *Electroreduction of Quaternary Ammonium Compounds*, Feb. 20, 1963.

*Primary Examiner*—Charles L. Bowers, Jr.
*Assistant Examiner*—Christopher G. Young
*Attorney, Agent, or Firm*—Bell, Seltzer, Park & Gibson

[57] ABSTRACT

A photoresist composition is disclosed that comprises an organic resin that is thermoset by acid catalysis and a photoactive, etch-resistant ionic modifier formed of an anion and a cation. The modifier is present in the organic resin in an amount effective to produce substantial photoreactivity and etch resistance in a mixture of the resin and the modifier. The cation will, upon exposure to electromagnetic radiation, produce a species that is weakly basic or neutral, and the anion will, upon exposure to electromagnetic radiation, produce an acid precursor that will form a relatively strong acid in an acid-base solvent system. As a result, the relatively strong acid will catalyze the organic resin upon exposure to an appropriate frequency of electromagnetic radiation and the relatively weak base or neutral species formed by the cation will not substantially neutralize the acid or interfere with the acid catalyzed reaction of the organic resin.

19 Claims, No Drawings

IONIC MODIFICATION OF ORGANIC RESINS AND PHOTORESISTS TO PRODUCE PHOTOACTIVE ETCH RESISTANT COMPOSITIONS

FIELD OF THE INVENTION

The present invention relates to photoresists, and in particular relates to ionic modifiers which can provide resists with both photoreactivity and resistance to reactive ion etching.

BACKGROUND OF THE INVENTION

Photoresists are compositions (often solutions) used in the production of miniaturized electronic devices and circuits such as those commonly referred to as integrated circuits or "chips." Such devices are generally formed of a semiconductor material (of which silicon is typically most common) insulator materials (often silicon dioxide $SiO_2$) and conductive materials (typically metals). These materials must be formed in very small and yet very precise geometric patterns ("geometries") both as individual devices and as groups of devices or circuits.

A present method for forming the appropriate geometries in such materials is a photographic-related technique in which the pattern to be formed in a material is first designed as a mask. A mask is a set of images fabricated on a transparent substrate (often glass) and having opaque and transparent parts which represent all, or portions, of the predetermined pattern of the semiconductor, metal or insulating material, or any combination of these which is required to form the device or chip.

In a common aspect of this technique, a mask is applied to a material to be patterned after the material has been coated with a light sensitive material generally referred to as a photoresist, or sometimes simply a resist. In order to carry out the required tasks, a photoresist material must be sensitive to light and resistant to particular chemical or physical reactions. Most commonly, projection lithography is used in which light is projected through the mask and onto the surface of a wafer of material. Other mechanisms can be used, for example electron beam irradiation, but for purposes of the present invention, the use of visible or ultraviolet light as the source of electromagnetic energy is an appropriate example, it being understood that other wavelengths of electromagnetic energy, as well as sources such as electron beams, can be used in a manner completely analogous to that described herein.

Typical photoresists are solutions of low molecular weight organic resins in appropriate solvents along with one or more photosensitive compounds. For example, common resists incorporate novolac (phenol-formaldehyde) resins in solvents such as propylene glycol methyl ether acetate or 2-ethoxy ethyl acetate, with photosensitive compounds such as the diazonapthoquinones. When the photoresist solution is applied to a surface, and the solvents evaporated away, a solid photosensitive film remains.

When the solid photoresist is exposed through a mask, photoreactions take place in the exposed portions but not in the unexposed portions. Following chemical treatment, one or the other of the portions is then removed, depending upon the chemical treatment or the pattern desired. The patterned material is then treated in the manner called for by the next particular step in the manufacturing process. Often, such a next step is etching in which the areas coated with the pattern of photoresist are intended to remain, while the areas from which the photoresist has been removed in conjunction with a pattern, are intended to be etched away.

A problem arises, however, in the use of certain etching techniques, particularly reactive ion etching (RIE) and more particularly RIE's containing oxygen. Reactive ion etching's nature is such that it tends to remove the photoresist undesirably along with the desirable removal of the uncoated areas. As a result, the integrity of the pattern, and thus the device and the circuits, is attacked by such etching. Such a result is, of course, generally disadvantageous or even unacceptable.

Accordingly, photoresist compositions which are further resistant to etching in reactive ion etches are useful compositions. Such etch resistant photoresists have been developed and are described for example in U.S. Pat. Nos. 4,968,582 and 5,114,827 to Tranjan, et al, the contents of which are incorporated entirely herein by reference. These patents demonstrate that typical photoresists, when modified with phosphorous-containing compounds are exceptionally resistant to reactive ion etching in oxygen-containing plasmas.

The success of such modified photoresists has, however, raised additional considerations. For example, photoresists typically contain large amounts of the photoactive compound in the resin, and adding an additional etch resistant compound can bring the photoresist solution to a rather high concentration. For example, photoactive and etch resistant modifiers can make up as much as 30 percent or more of a photoresist composition. Such high percentages of solute in the organic solvent can cause problems under certain circumstances from the standpoint of undissolved solids, viscosity, and other problems related to the high concentration.

Therefore, a desirable photoresist would be one in which photoreactivity was present as well as etch resistance, but with the amount of solute minimized as compared to the amount of organic solvent.

OBJECT AND SUMMARY OF THE INVENTION

Therefore, it is an object of the present invention to provide a photoresist composition in which the amount of photoactive and etch resistant modifier can be minimized, and in particular to provide a photoresist in which a single modifier provides both etch resistance and photo sensitivity. The invention meets this object with a photoresist composition formed of an organic resin and a photoactive, etch resistant ionic modifier formed of an anion and a cation.

The cation is cleavable by a photon to produce species that are weakly basic or neutral and the anion is able to release an electron and leave a radical that will form a relatively strong acid in an acid-base solvent system. As a result, the relatively strong acid will catalyze the organic resin upon exposure to an appropriate frequency of electromagnetic radiation and the relatively weak base or neutral species formed by the cation will not substantially neutralize the acid or interfere with the acid-catalyzed reaction of the resin.

The foregoing and other objects, advantages and features of the invention and the manner in which the same are accomplished will become more readily apparent upon consideration of the following detailed description of the invention.

DETAILED DESCRIPTION

The present invention is a photoresist composition which comprises an organic resin that reacts in the presence of an acid, and a photoactive, etch resistant ionic modifier formed of an anion and a cation. The modifier is present in the organic resin in an amount effective to produce substantial photoreactivity and etch resistance in a mixture of the resin and the modifier and will, upon exposure to an electromagnetic radiation, produce a species that is weakly basic or neutral. The anion will, upon exposure to electromagnetic radiation, produce an acid precursor that will form a relatively strong acid in an acid base solvent system. As a result, the relatively strong acid will catalyze the organic resin upon an exposure to an appropriate frequency of electromagnetic radiation and the relatively weak base or neutral species formed by the cation will not substantially neutralize the acid or interfere with the acid catalyzed reaction of the organic resin.

As used herein with respect to the organic resin, the phase "reacts in the presence of an acid" refers to several types of well-known reactions. These can include cross-linking, depolymerization or deprotection reactions which are either catalyzed by an acid, or include an acid as a reactant. In typical examples the cross-linked portions of the resin are less soluble in aqueous basic developing solutions than are their precursors, and the result is a negative-tone resist system. In deprotection reactions, the exposed regions (i.e. where acid is present) are rendered soluble in basic developing solutions resulting in a positive tone resist system. In depolymerization, the acid (proton) is often consumed as a reactant while the exposed regions are rendered soluble in basic aqueous developing systems, again producing a positive resist system.

It will be understood by those familiar with photoresists that the above represent exemplary reactions and are otherwise not limiting of the invention described and claimed herein.

As is further known to those of skill in this art, a typical organic resin that is exemplary of those useful with the present invention is the phenol-formaldehyde type of resin, which is also referred to as a novolac resin.

In one embodiment, the ionic modifier contains phosphorous in an amount effective to provide etch resistance to the composition. In preferred embodiments, the modifier is present in an amount of between about 2% and 10% by weight phosphorous based upon the weight of the photoresist composition.

The cation in the ionic modifier is selected so that it will, upon exposure to electromagnetic radiation, produce a species that is weakly basic or neutral. Although the inventors do not wish to be bound by any particular theory, it appears that the cation should be selected to cleave to form a relatively stable radical, the stability of free radicals being relatively well understood by those of ordinary skill in organic chemistry; see for example, the discussion in *Morrison & Boyd*, pages 123–125 and 386–398, 2d Edition 1966. Cations which qualify and which also include the phosphorous useful for etch resistance include phosphine iminium, or phosphonium cations. Phosphines have the general formula $PR_3$ (R designating an alkyl group), phosphine iminium have the general formula $[R_3P=N=PR_3]^+$, and phosphonium cations have the general formula $[PR_4]^+$. In particular, preferred phosphoniums are selected from the group consisting of aryl, alkyl, and aryl-alkyl phosphoniums.

In other embodiments, the cation can be selected from the group consisting of triphenylfluorobutylphosphonium $(C_6H_5)_3C_4F_9P^+$, tetrabutylphosphonium $(C_4H_9)_4P^+$, tetrabutylammonium $(C_4H_9)_4N^+$, tetraheptylammonium $(C_7H_{15})_4N^+$, and tetrahexylammonium $(C_6H_{13})_4N^+$. In other embodiments, the cation can be selected from the group consisting of bis(triphenylphosphine)iminium, bis(trioylphosphine) iminium, bis(methyldiphenylphosphine)iminium, tetraphenylphosphonium $(C_6H_5)_4P^+$, tetraoylphosphonium, butyltriphenylphosphonium $(C_6H_5)_3C_4H_9P^+$, and tributylphenylphosphonium $(C_4H_9)_3C_6H_5P^+$. With these last recited cations, a preferred anion comprises hexafluorophosphate, $PF_6^-$.

In order to be useful in the present invention, the cation should produce species that are weakly basic or neutral when the modifier is exposed to electromagnetic radiation in the visible or ultraviolet portions of the spectrum or to an electron beam. The invention is not limited to such frequencies, but those familiar with photolithography of semiconductor devices will recognize these as commonly used frequencies in the electromagnetic spectrum for such purposes.

From the theoretical standpoint, it appears that a preferred cation will be one that is cleavable into the weakly basic or neutral species by a photon in the visible portion of the spectrum or the ultraviolet portion of the spectrum. As presently best understood, electromagnetic radiation initiates a charge transfer reaction between the cation and the anion that produces the weakly basic or neutral species from the cation and produces the acid precursor from the anion.

Further to preferred embodiments, it appears from a theoretical basis that preferred anions will release an electron upon exposure to electromagnetic radiation to produce the acid precursor, which most preferably is a radical.

In preferred embodiments, the anion is selected from the group consisting of hexafluorophosphate, hexafluoroarsenate $AsF_6^-$, hexafluoroantimonate $SbF_6^-$, hexafluorotitinate $TiF_6^-$, hexafluoroaluminate $AlF_6^{-3}$, hexafluoroiron(III) $FeF_6^{-3}$, hexafluorostanate $SnF_6^{-4}$, hexafluorosilicate $SiF_6^{-2}$, hexametaphosphate, and hexamethyldisilazane. In other embodiments, the anion is a halide ion, of which iodide $(I^-)$ is a preferred example. The anion preferably produces an acid precursor that will form a relatively strong acid in an acid based solvent system when the modifier is exposed to electromagnetic radiation in the visible or ultraviolet portions of the spectrum.

In another embodiment, the invention comprises a semiconductor device precursor surface, such as a wafer of semiconductor material, insulator material or metals, coated with the photoresist of the present invention.

In another embodiment, the invention can comprise a modified photoresist that already includes a photoinitiator such as the diazoquinones. In such an embodiment, the photoresist is modified with an ionic modifier that can increase the etch resistance of the photoresist to etching plasmas such as sulfur hexafluoride $(SF_6)$, boron trichloride $(BCl_3)$ with chlorine $(Cl_2)$, or bromine $(Br_2)$. The modifier has a cation selected from the group consisting of tetrabutylphosphonium, tetrabutylammonium, tetraheptylammonium, and tetrahexylammonium. The modifier has an anion selected from the group consisting of hexafluorophosphate, hexafluoroarsenate, hexafluoroantimonate, hexafluorotitinate, hexafluoroaluminate, hexafluoroiron(III), hexafluorostanate, hexafluorosilicate, hexametaphosphate, and hexamethyldisilazane.

In yet another embodiment, the invention comprises a semiconductor device precursor surface coated with the photoresist of this embodiment.

In yet another embodiment, the invention can comprise the method of forming a photoactive photoresist composition that is resistant to reactive ion etching. The method comprises admixing an acid catalyzed organic resin with a photoactive etch resistant ionic modifier formed of an anion and a cation in an amount effective to produce substantial photoreactivity and substantial etch resistance to reactive ion etching plasmas. As in the previous embodiments, the cation will, upon exposure to electromagnetic radiation, produce a species that is weakly basic or neutral. The anion will, upon the same exposure to electromagnetic radiation, produce an acid precursor that will form a relatively strong acid in an acid based solvent system. As a result, the relatively strong acid catalyzes the organic resin upon exposure to an appropriate frequency of electromagnetic radiation and the relatively weak base or neutral species formed by the cation will not substantially neutralize the acid or interfere with the acid catalyzed reaction of the resin.

In its method aspects, the invention can further comprise the step of applying the photoresist composition to a surface to be patterned, such as a surface of semiconductor material, insulator, or conductive material such as metal.

The invention can further comprise the step of exposing the applied photoresist composition to electromagnetic radiation (or an electron beam), following which the invention can comprise the steps of developing the exposed photoresist and etching the developed resist in a reactive ion etching plasma.

The invention thus provides a combination of etch resistance with photoreactivity in a single modifier so that the relatively large amount of additives otherwise required in most photoresists can be reduced.

Specific examples from the anions and cations set forth above are explanatory of the apparent mechanism of the modifiers of the invention. Because the behavior of photoresists is preferably controlled by acid catalysis, these anions and cations produce strong enough acids to produce the acid catalysis, while avoiding concurrently producing a basic species that is strong enough to neutralize the effect of that acid. For example, when phenyltrimethylammonium iodide $C_6H_5(CH_3)_3NI$ is used as a modifier, charge transfer produces a phenyl radical, trimethyl ammonia, and atomic iodine.

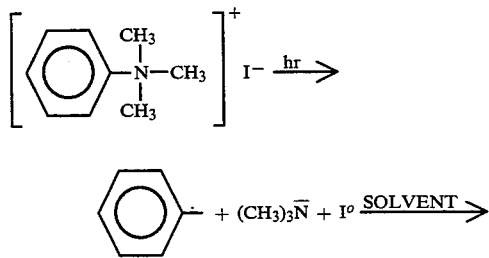

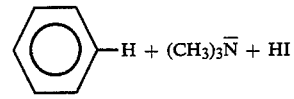

The atomic iodine, of course, has seven valance electrons and rapidly picks up a hydrogen atom (H) usually from the solvent, as will the phenyl radical. The resulting products are benzene ($C_6H_6$), trimethyl ammonia ($(CH_3)_3N$) and hydroiodic acid (HI). The hydroiodic acid is a relatively strong acid, but the trimethyl amine is a relatively strong base. As a result the acid is neutralized and forms trimethyl ammonium iodide. Accordingly, although this modifier is photoreactive, it also tends to neutralize the acid it produces, and thus will not satisfactorily acid-catalyze a photoresist.

In comparison, triphenyl sulfonium iodide $(C_6H_5)_3SI$ works satisfactorily. When exposed to visible or UV light, it appears that a photon causes a charge transfer reaction of an electron from the iodide anion to the sulfonium cation. The charge transfer in turn produces a phenyl radical, diphenyl sulfide and iodine. In the final step, the resulting products are benzene, diphenyl sulfide, and hydroiodic acid.

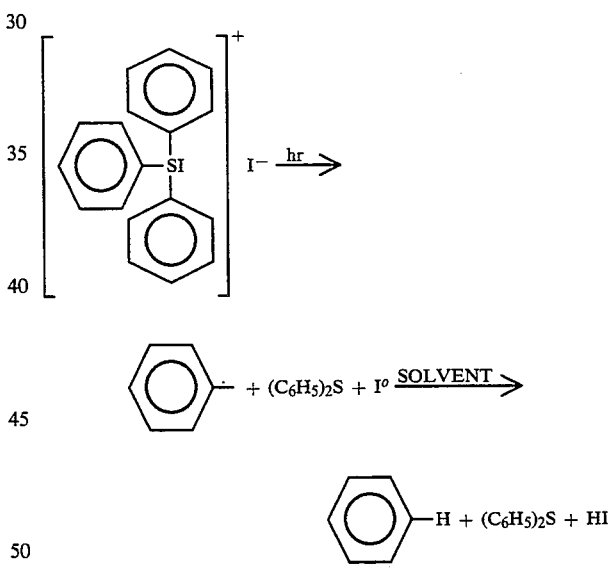

Because the diphenyl sulfide is a relatively weak base, it will fail to trap or tightly bind the proton of the relatively strong hydroiodic acid. As a result, the resist solution will remain acidic, rather than being neutralized. The solution will thus catalyze resins sensitive to the presence of the acid (as described previously herein), making the modifier photoreactive. Triphenyl sulfonium antimony hexafluoride behalves similarly and demonstrates appropriate photoreactivity.

As a exemplary phosphorous containing compound, triphenylperfluorobutyl phosphonium iodide will, upon exposure to light, undergo a charge transfer reaction in which the electron from the iodide cleaves the phosphonium ion into triphenylphoshine, fluorobutane ($C_4HF_9$), and hydroiodic acid.

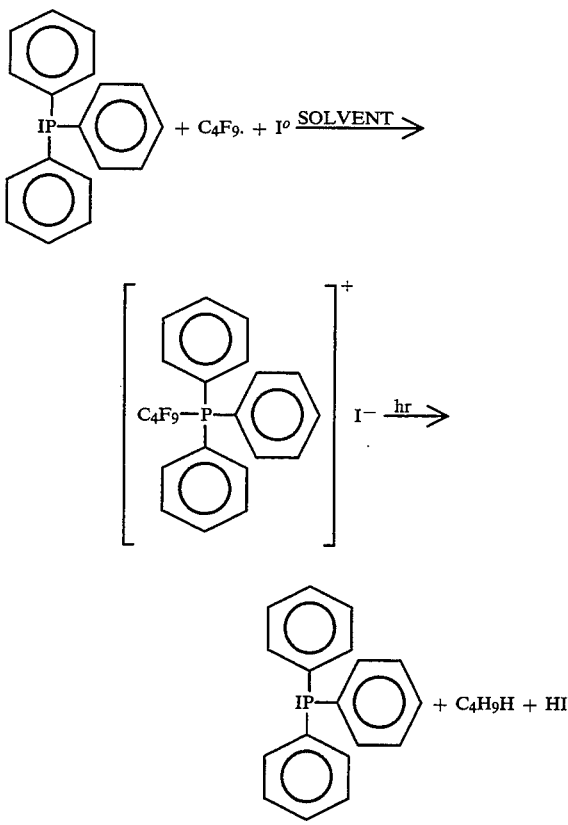

Again, the hydroiodic acid provides the acid catalysis, while the fluorobutane has little or no effect on the acid-base chemistry of the environment, and the triphenylphosphine is a weak base which will not neutralize the catalytic activity of the hydroiodic acid.

Thus, from a theoretical standpoint, it appears best to include an anion that can give up an electron to leave a radical which can pick up a hydrogen from the solvent to become a strong acid, and a cation that can accept an electron and form a stable species, potentially including a stable radical, that does not lead to a strong base.

The underlying charge transfer mechanisms are well enough understood to provide a basic foundation for the claimed invention. Such reactions are discussed in some of the references cited herein including Griffin, *Photolysis of Benzyl Triphenyl Phosphonium and Tetraphenyl Phosphonium Chlorides*, Tetrahedron Letters No. 12, Pages 773–775, 1965; Walsh, *Photochemistry of Aromatic Ions, Photolysis of Quaternary Anylinium Salts*, JACS, 89, 3943 (1967) (Dektar, *A New Mechanism for Photodecomposition and Acid Formulation from Triphenylsulfonium Salts*, J. Chem. Soc. Chem. Commun. 1987, Page 1591; Schwalm, *Photolysis of Tris(4-Tert-Butoxycarbonyloxyphenyl) Sulfonium Salts—A Mechanist's Study*, J. Chem. Soc. Perkin. Trans 2 (1991), and Finkelstein, *Electrochemical Degradation of Sulfonium Salts*, J. Electrochemical Soc. 110, 492–493 (May 1968).

In summary, the invention provides new groups of photoactive compounds which, in addition to their function as photoactive compounds, can provide plasma etch resistance to their films by selecting an appropriate counter anion for the photoactive cation.

Furthermore, the ionic modifiers represent a broad group of ionic compounds which can be used to modify photoresist solutions to yield their films resistant to oxygen plasmas as well as other etch plasmas. These modifiers are distinguished from previous silicon and phosphorous modifiers because they are ionic rather than molecular, and are materials which are introduced directly into photoresist solutions, and because they can be added separately or in combination to achieve etch resistance to a particular etch plasma. In addition, these modifiers can be used with standard photoresists and acid catalyzed photoresists as well as direct photodepolymerization and direct photocrosslinking photoresists.

In the specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A photoresist composition comprising:
   an admixture of an organic resin that reacts in the presence of an acid; and
   a photoactive, etch resistant ionic modifier formed of an anion and a phosphonium cation, said modifier being present in said organic resin in an amount effective to produce substantial photoreactivity and etch resistance in a mixture of said resin and said modifier;
   said phosphonium cation being characterized in that it will, upon exposure to electromagnetic radiation, produce a photoreaction species that is weakly basic or neutral; and
   said anion being characterized in that it will, upon exposure to electromagnetic radiation, produce an acid precursor that will form a relatively strong acid in an acid-base solvent system;
   whereby said relatively strong acid will catalyze the organic resin upon exposure to an appropriate frequency of electromagnetic radiation and said relatively weak base or neutral species formed by said cation will neither substantially neutralize said acid nor interfere with the acid reaction of said organic resin.

2. A photoresist composition according to claim 1 wherein said acid precursor is a radical.

3. A photoresist composition according to claim 1 wherein said phosphonium is selected from the group consisting of aryl, alkyl, and aryl-alkyl phosphoniums.

4. A photoresist composition according to claim 1 wherein said anion is a halide ion.

5. A photoresist composition according to claim 1 wherein said anion is iodide.

6. A photoresist according to claim 1 wherein said cation is selected from the group consisting of: triphenylfluorobutylphosphonium and tetrabutylphosphonium.

7. A photoresist composition according to claim 1 wherein said resin comprises a phenol-formaldehyde resin.

8. A photoresist composition according to claim 1 wherein said cation produces species that are weakly basic or neutral when said modifier is exposed to electromagnetic radiation in the visible portion of the spectrum.

9. A photoresist composition according to claim 1 wherein said cation produces a species that is weakly basic or neutral when said modifier is exposed to electromagnetic radiation in the ultraviolet portion of the spectrum.

10. A photoresist composition according to claim 1 wherein said modifier is present in an amount of between about 2 and 10% by weight based upon the weight of the resist composition.

11. A photoresist composition according to claim 1 wherein said anion produces an acid precursor that will form a relatively strong acid in an acid-base solvent system when said modifier is exposed to electromagnetic radiation in the visible portion of the spectrum.

12. A photoresist composition according to claim 1 wherein said anion produces an acid precursor that will form a relatively strong acid in an acid-base solvent system when said modifier is exposed to electromagnetic radiation in the ultraviolet portion of the spectrum.

13. A photoresist composition according to claim 1 wherein said anion produces an acid precursor that will form a relatively strong acid in an acid-base solvent system when said modifier is exposed to an electron beam.

14. A photoresist composition according to claim 1 wherein electromagnetic radiation will initiate a charge transfer reaction between said cation and said anion that produces said weakly basic or neutral species from said cation and said acid precursor from said anion.

15. A photoresist composition according to claim 1 wherein said organic resin is acid catalyzed.

16. A photoresist composition according to claim 1 wherein said organic resin is deprotonated in the presence of an acid.

17. A photoresist composition according to claim 1 wherein said organic resin is depolymerized in the presence of an acid.

18. A semiconductor device precursor surface coated with the photoresist of claim 1.

19. A semiconductor device precursor surface coated with the photoresist of claim 2.

* * * * *

UNITED STATES PATENT AND TRADEMARK OFFICE
CERTIFICATE OF CORRECTION

PATENT NO. : 5,393,642
DATED : February 28, 1995
INVENTOR(S) : DuBois et al.

It is certified that error appears in the above-identified patent and that said Letters Patent is hereby corrected as shown below:

Column 7, line 28, in the equation, "$H_9H$" should be --$F_9H$--.

Signed and Sealed this

Twentieth Day of February, 1996

Attest:

BRUCE LEHMAN

Attesting Officer

Commissioner of Patents and Trademarks